United States Patent
Marotta et al.

(10) Patent No.: US 6,697,283 B2
(45) Date of Patent: Feb. 24, 2004

(54) TEMPERATURE AND VOLTAGE COMPENSATED REFERENCE CURRENT GENERATOR

(75) Inventors: Giulio Giuseppe Marotta, Contigliano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,364

(22) Filed: Aug. 27, 2002

(65) Prior Publication Data

US 2003/0058694 A1 Mar. 27, 2003

Related U.S. Application Data

(63) Continuation-in-part of application No. 10/036,757, filed on Dec. 21, 2001.

(30) Foreign Application Priority Data

Jan. 3, 2001 (IT) .................................. RM2001A0001
Aug. 31, 2001 (IT) .................................. RM2001A0528

(51) Int. Cl.$^7$ ................................................ G11C 16/06
(52) U.S. Cl. .................................. 365/185.21; 365/210
(58) Field of Search .............................. 365/185.21, 210

(56) References Cited

U.S. PATENT DOCUMENTS

| | | | |
|---|---|---|---|
| 5,289,412 A | | 2/1994 | Frary et al. |
| 5,629,892 A | | 5/1997 | Tang |
| 5,654,918 A | | 8/1997 | Hammick |
| 5,784,314 A | | 7/1998 | Sali et al. |
| 5,790,459 A | | 8/1998 | Roohparvar |
| 5,898,617 A | * | 4/1999 | Bushey et al. ............ 365/185.2 |
| 5,903,504 A | | 5/1999 | Chevallier et al. |
| 5,982,676 A | * | 11/1999 | Poplevine et al. ...... 365/189.06 |
| 6,038,169 A | | 3/2000 | Ogura et al. |
| 6,052,307 A | | 4/2000 | Huber et al. |
| 6,078,518 A | | 6/2000 | Chevallier |
| 6,185,130 B1 | | 2/2001 | Hollmer et al. |
| 6,205,056 B1 | | 3/2001 | Pan et al. |
| 6,226,213 B1 | | 5/2001 | Chih |
| 6,229,734 B1 | | 5/2001 | Watanabe |
| 6,240,016 B1 | | 5/2001 | Haddad et al. |
| 6,320,790 B1 | * | 11/2001 | Micheloni ................. 365/185.2 |
| 6,411,549 B1 | * | 6/2002 | Pathak et al. ............. 365/185.2 |
| 6,584,003 B1 | * | 6/2003 | Kim et al. ..................... 365/49 |
| 6,600,692 B2 | * | 7/2003 | Tanzawa ....................... 365/226 |

* cited by examiner

Primary Examiner—Michael S. Lebentritt
Assistant Examiner—Tuan T. Nguyen
(74) Attorney, Agent, or Firm—Leffert Jay & Polglaze, P.A.

(57) ABSTRACT

Reference current generators are described for producing a reference current ($I_{ref}$) that is proportional to an expected sensed current of a target floating-gate memory cell in its conductive state. The reference current ($I_{ref}$) is compensated to track the expected sensed current across variations in both ambient temperature and supply voltage. The reference current generators are able to track the expected sensed current of a floating-gate memory cell without using a floating-gate transistor in the generator.

27 Claims, 5 Drawing Sheets

TEMPERATURE AND VOLTAGE COMPENSATED REFERENCE CURRENT GENERATOR

RELATED APPLICATIONS

This application claims priority to Italian Patent Application Serial No. RM2001A000001, filed Jan. 3, 2001, entitled "Sensing Scheme for Low-Voltage Flash Memory" and its corresponding U.S. patent application Ser. No. 10/036,751, filed Dec. 21, 2001 of the same title, as well as Italian Patent Application Serial No. RM2001A000528, filed Aug. 31, 2001, entitled "Temperature and Voltage Compensated Reference Current Generator," which are commonly assigned. This application is a continuation-in-part of the aforementioned Ser. No. 10/036,751 application, which is incorporated herein by reference.

TECHNICAL FIELD OF THE INVENTION

The present invention relates generally to semiconductor memory devices, and in particular, the present invention relates to generating reference currents used in sensing data values in semiconductor flash memory devices.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory. Portable applications such as digital cameras, audio recorders, personal digital assistants (PDAs) and test equipment also use flash memory as a medium to store data.

The threshold voltage of the floating-gate field effect transistor used in the floating-gate memory cell is indicative of its data value. The data value of the floating-gate memory cell is determined by sensing a current through the floating-gate transistor when a gate bias is applied to its control gate. The gate bias activates the transistor when the threshold voltage is indicative of a first programmed state and leaves the transistor substantially deactivated when the threshold voltage is indicative of a second programmed state. Typically, a charge stored on the floating gate varies the threshold voltage. However, as another example, the threshold voltage can be varied by fabricating the floating gate using a ferroelectric material and varying the polarization of the ferroelectric material.

Sensing a current indicative of a data value of a memory cell is typically facilitated with a reference current. The reference current can be used to develop a reference potential. This reference potential can be compared to a potential level developed by a target memory cell using a differential sensing device. Alternatively, the reference current can be combined with a sensed current as input to a single-ended sensing device. In this manner, the reference current is used to overcome any leakage of a target memory cell and reduce the likelihood of a false indication of an erased state of the target memory cell. To maintain consistency in sensing, the reference current is preferably proportional to the expected sensed current from an erased target cell across a variety of operating conditions.

Whether using differential or single-ended sensing, the reference current is typically developed using reference current generators based on a floating-gate field-effect transistor. There are typically many reference current generators in a memory device to maintain the load on each generator within acceptable power limits. Fabrication variability across a number of reference current generators can lead to large variations in the conductance of these transistors and the resulting reference currents. In order to generate reproducible reference currents across a memory device, it is generally desirable to trim each of these floating-gate transistors during testing of the memory device. This is a cumbersome operation.

For the reasons stated above, and for other reasons stated below which will become apparent to those skilled in the art upon reading and understanding the present specification, there is a need in the art for alternative reference current generators, as well as memory devices and electronic systems making use of such reference current generators.

SUMMARY OF THE INVENTION

The above-mentioned problems with memory devices and other problems are addressed by the present invention and will be understood by reading and studying the following specification.

Reference current generators are described for producing a reference current that is proportional to an expected sensed current of a target floating-gate memory cell in its conductive state. The reference current is compensated to track the expected sensed current across variations in both ambient temperature and supply voltage. The reference current generators are able to track the expected sensed current of a floating-gate memory cell without using a floating-gate transistor in the generator.

For one embodiment, the invention provides a reference current generator. The reference current generator includes a reference current path having a control node coupled to receive a reference current control signal and having an output for providing a reference current responsive to the reference current control signal. The reference current generator further includes a reference current control signal generator for generating the reference current control signal. The reference current control signal generator includes an output node coupled to the control node of the reference current path and a diode coupled between a first potential node and the output node of the reference current control signal generator. The first potential node is coupled to receive a first potential. The reference current generator further includes a resistive component coupled between a second potential node and the output node of the reference current control signal generator. The second potential node is coupled to receive a second potential.

For another embodiment, the invention provides a reference current generator. The reference current generator includes a reference current control signal generator for generating a reference current control signal on an output node. The reference current control signal generator includes a plurality of diode-connected p-channel field-effect transistors, each diode-connected p-channel field-effect transistor having a first source/drain region coupled to receive a first potential from a first potential node, a second source/drain region coupled to the output node of the reference current control signal generator, and a gate coupled to the output node of the reference current control signal generator. The reference current control signal generator further includes a first n-channel field-effect transistor having a first source/drain region coupled to the output node of the reference current control signal generator, a second source/drain region, and a gate coupled to receive a first control signal. The reference current control signal generator further includes a second n-channel field-effect transistor having a first source/drain region coupled to the second source/drain region of the first field-effect transistor, a second source/drain region, and a gate coupled to receive the first control signal. The reference current control signal generator still further includes a resistive component having an input coupled to the second source/drain region of the second field-effect transistor and an output coupled to receive a second potential from a second potential node. The resistive component includes a first resistive element coupled between the second source/drain region of the second field-effect transistor and the second potential node and a third n-channel field-effect transistor coupled between the first resistive element and the second potential node, the third n-channel field effect transistor having a gate coupled to receive the first control signal. The reference current generator further includes a reference current path having a p-channel field-effect transistor coupled between a third potential node and an output of the reference current path and having a gate coupled to receive the reference current control signal. Each p-channel field-effect transistor of the plurality of diode-connected p-channel field-effect transistors is sized to be substantially identical to the p-channel field-effect transistor of the reference current path.

For yet another embodiment, the invention provides a flash memory device. The memory device includes an array of floating-gate memory cells and a sensing device coupled for sensing a programmed state of a target floating-gate memory cell. The sensing device is selectively coupled to the target floating-gate memory cell through one or more pass circuits. The memory device further includes a reference current path having a control node coupled to receive a reference current control signal and an output coupled to provide a reference current to the sensing device. The reference current is inversely proportional to a value to the reference current control signal. The memory device further includes a reference current control signal generator for generating the reference current control signal, wherein the reference current control signal generator. The reference current control signal generator includes an output node coupled to the control node of the reference current path, a diode coupled between a first potential node and the output node of the reference current control signal generator, and a resistive component coupled between a second potential node and the output node of the reference current control signal generator. The first potential node is coupled to receive a first potential and the second potential node is coupled to receive a second potential lower than the first potential. The memory device further includes a circuit coupled between the diode and the resistive component circuit that mimics the resistance characteristics of the pass circuits.

The invention further provides memory devices and other apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Memory devices typically utilize a sensing device to sense and amplify the data value of a memory cell. Many nonvolatile memory devices utilize conductance to indicate the programmed state of a memory cell. Such devices typically alter the threshold voltage of a field-effect transistor to achieve the varying levels of conductance. Examples include floating-gate field-effect transistors whose threshold voltage is determined by a charge stored on a floating gate, such as a floating gate made of a conductive polysilicon material, or by a polarization of the floating gate, such as a floating gate made of a ferroelectric material.

In memory cells whose programmed state or data value is determined by conductance, the sensing device often utilizes a reference current when sensing the data value. For example, the reference current may be compared to a current passing through a target memory cell. In this example, the reference current and the sensed current can be used to develop potentials on their respective inputs of a differential sensing device with the relative potential differential defining the data value of the target memory cell. As another example, the reference current may be combined with the current passing through the target memory cell. In this example, the combined currents can be used to develop a potential on an input of a single-ended sensing device with this potential defining the data value of the target memory cell.

Figure 1A:
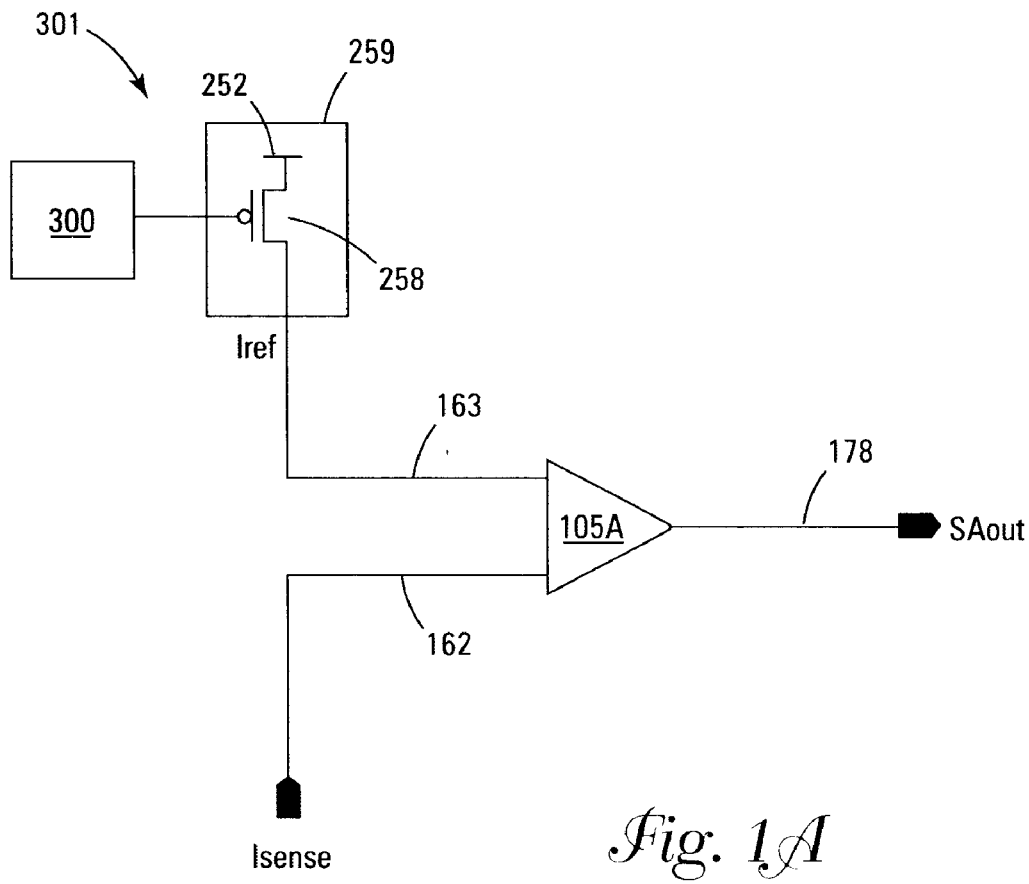
FIG. 1A is a simplified schematic of a differential sensing device coupled to receive a reference current from a reference current generator in accordance with an embodiment of the invention.

FIG. 1A is a simplified schematic of a differential sensing device 105A having a first input 162 coupled to receive a sensed current, $I_{sense}$, and a second input 163 coupled to receive a reference current, $I_{ref}$. The sensing device 105A further has an output 178 for providing a signal indicative of the data value represented by the sensed current $I_{sense}$. The reference current $I_{ref}$ is generated by a reference current path 259 in response to a control signal from a reference current control signal generator 300 in accordance with an embodiment of the invention. The reference current control signal generator 300 and the reference current path 259 collectively make up a reference current generator 301.

Figure 1B:
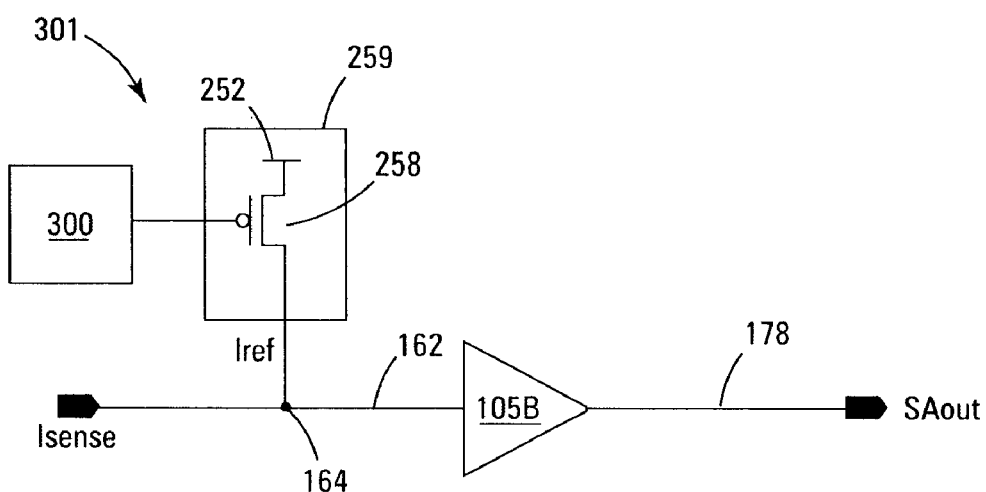
FIG. 1B is a simplified schematic of a single-ended sensing device coupled to receive a reference current from a reference current generator in accordance with another embodiment of the invention.

FIG. 1B is a simplified schematic of a single-ended sensing device 105B having an input 162 coupled to receive a sensed current, $I_{sense}$, and coupled to receive a reference current, $I_{ref}$. The sensed current and the reference current are thus combined for input to the sensing device 105B. The sensing device 105B further has an output 178 for providing a signal indicative of the data value represented by the sensed current $I_{sense}$. The reference current $I_{ref}$ is generated by a reference current path 259 in response to a control signal from a reference current control signal generator 300 in accordance with an embodiment of the invention. The reference current control signal generator 300 and the reference current path 259 collectively make up a reference current generator 301.

While the reference current paths 259 in FIGS. 1A–1B are shown to include a p-channel field-effect transistor (pFET) 258 coupled between a potential node 252 and an input of a sensing device 105, other circuitry will suffice. In general, the behavior of the reference current path 259 is to produce a reference current $I_{ref}$ that is inversely proportional to a value of the reference current control signal received from the reference current control signal generator 300. The potential node 252 is generally coupled to receive a supply potential, such as Vcc. Increasing the potential level to the gate of the pFET 258 will result in decreasing conductance of the pFET 258, thus satisfying the inverse relationship.

Figure 2:
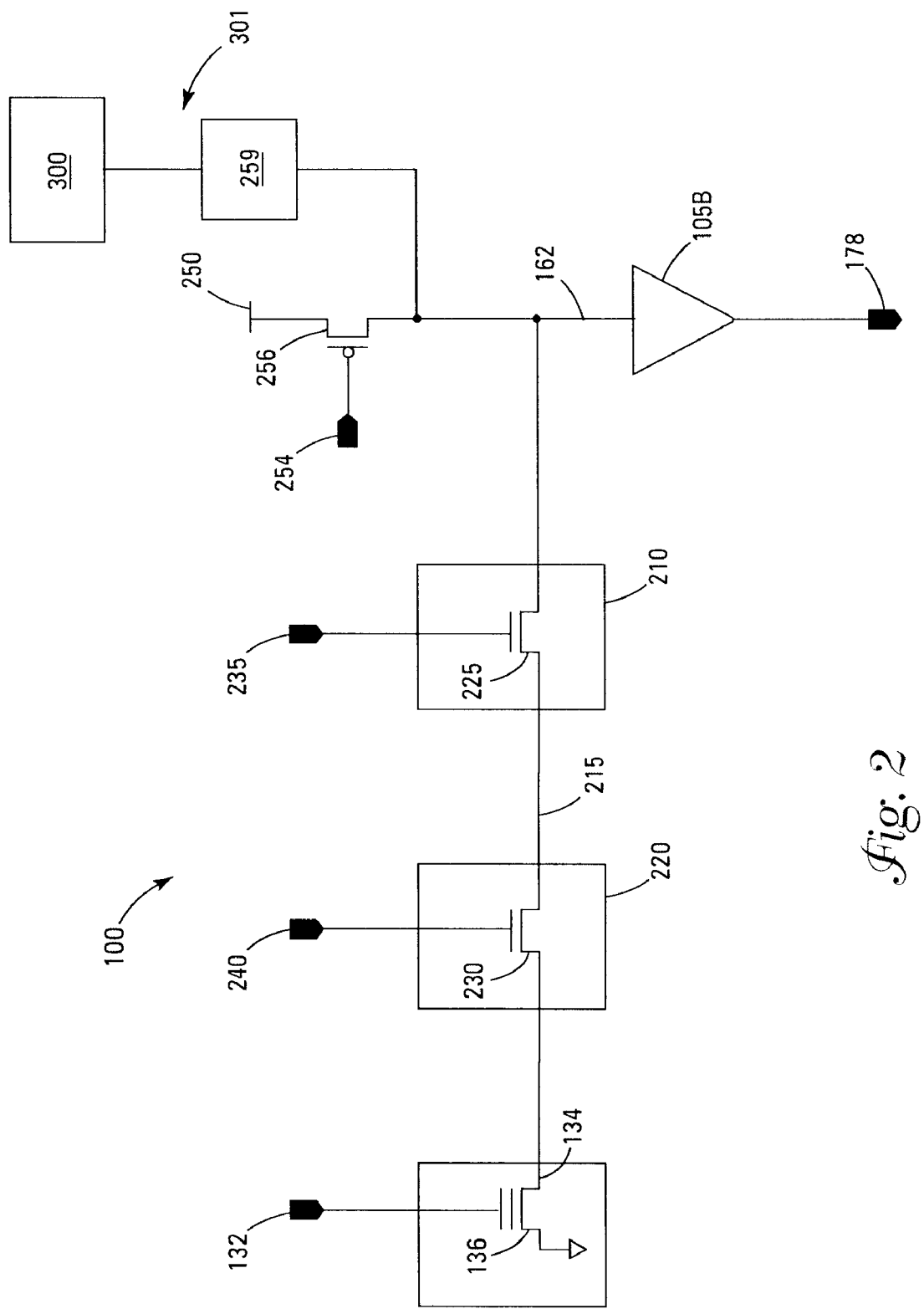
FIG. 2 is a schematic of a portion of a memory device using a reference current in accordance with an embodiment of the invention.

FIG. 2 is a schematic of a portion of a memory device 100 having a sensing device 105B coupled to receive a reference current in accordance with an embodiment of the invention. The memory device 100 includes an array of memory cells 136. For flash memory devices, arrays of memory cells are often configured as floating-gate transistors 136 placed at the intersection of word lines 132 and local bit lines 134. The word lines 132 are coupled to the control gates of the floating-gate transistors 136. The local bit lines 134 are coupled to the drains of the floating-gate transistors 136. As is known in the art, a memory device of the type described herein may be fabricated as an integrated circuit device on a die of a semiconductor substrate.

As shown in FIG. 2, a target memory cell 136 is selectively coupled to a sensing device 105B through its associated local bit line 134 and global bit line 215. There are generally many local bit lines 134 associated with a single global bit line 215 and many global bit lines 215 associated with a single sensing device 105B in typical high-density memory devices. The sensing device 105B is generally one of many sensing devices 105B contained in the sensing circuitry of a memory device 100.

The global bit line 215 associated with the target memory cell 136 is coupled to its associated sensing device 105B using pass circuit 210. Pass circuit 210 is depicted as containing a single selective coupling device or pass transistor 225 providing the selective coupling between the global bit line 215 and the sensing device 105B. The pass transistor 225 has a gate coupled to receive a control signal from node 235. Those skilled in the art of memory devices will recognize that pass circuit 210 would contain additional pass transistors associated with other global bit lines. Furthermore, additional pass transistors may be interposed between the global bit line 215 and the sensing device 105B.

The local bit line 134 associated with the target memory cell 136 is coupled to its associated global bit line 215 using pass circuit 220. Pass circuit 220 is depicted as containing a single selective coupling device or pass transistor 230 providing the selective coupling between the local bit line 134 and the global bit line 215. The pass transistor 230 has a gate coupled to receive a control signal from node 240. Those skilled in the art of memory devices will recognize that pass circuit 220 would contain additional pass transistors associated with other local bit lines. Furthermore, additional pass transistors may be interposed between the local bit line 134 and the global bit line 215. Pass circuits 210 and 220 may represent a portion of a column select circuit of the memory device 100.

The memory device 100 includes a precharging path for selectively applying the precharge potential to charge the local bit line 134, the global bit line 215, and the sensing device input 162. The precharging path is shown in FIG. 2 as the p-channel field-effect transistor (pFET) 256 coupled between a potential node 250 and the input 162. The potential node 250 is coupled to receive the precharge potential. The precharge potential may be a supply potential, such as Vcc. The pFET 256 selectively couples the potential node 250 to the input 162 in response to a control signal received at node 254.

The memory device 100 further includes a reference current path 259 for selectively applying a reference current to the input 162. The reference current path 259 may include a pFET 258 as shown in FIGS. 1A–1B having a gate coupled to receive a reference current control signal from the reference current control signal generator 300.

Ideally, a target memory cell 136 and its path to the sensing device 105B would exhibit a zero current draw if the floating-gate transistor of the target memory cell 136 were programmed, i.e., in a first programmed state, such that the input 162 would remain at the precharge potential during sensing. However, some residual current may be expected, whether such residual current is due to leakage, depletion, or some other phenomena. This residual current could result in an erroneous indication that the target memory cell is erased, i.e., in a second programmed state. The reference current path 259 provides a reference current to the input 162 to compensate for such residual currents and to avoid erroneous indications of the second programmed state.

The reference current should be less than a current flow through the target memory cell 136 if the target memory cell 136 is erased or in the second programmed state, yet more than the expected residual current. For one embodiment, the reference current is controlled to be less than half of the expected current of an erased memory cell in the second programmed state. For a further embodiment, the reference current is controlled to be approximately one order of magnitude less than the expected current of an erased memory cell in the second programmed state.

During sensing, if the target memory cell is in the second programmed state, the bit lines will be expected to drop to a potential below the precharge potential. The expected bit line potential is approximately the precharge potential minus the threshold voltage of the transistors minus some delta for ohmic drop across the bit lines.

Operation of the memory device 100 proceeds generally as follows. The bit lines 134 and 215 are decoded and coupled to the input 162 of a sensing device 105B. The decoded bit lines may be thought of as a single bit line coupled to the target memory cell. The bit line and the input 162 are precharged to the precharge potential from the potential node 250 and the word line 132 of the target memory cell 136 is driven. In addition, a reference current is applied to the input 162 of the sensing device 105B through the reference current path 259. The bit line is then isolated from the precharge potential while maintaining application of the reference current. The programmed state of the target memory cell 136 is sensed and amplified by the sensing device 105B. The data value at the output node 178 is then latched for access by an external device, such as a memory controller or other processor coupled to the memory device 100. The memory device 100 and its associated processor make up part of an electronic system. Some examples of electronic systems include peripheral devices, digital cellular and wireless devices, digital cameras, digital audio recorders, personal digital assistants (PDAs), etc.

A reference current generator 301 is used to generate the reference current. A reference current control signal generator 300 is used to control the reference current to mimic the expected residual current of the target memory cell. For one embodiment, the memory device 100 includes one such reference current control signal generator 300 associated with each sensing device 105B. For another embodiment, the memory device 100 includes one such reference current control signal generator 300 associated with some number of sensing devices 105B. For a further embodiment, the memory device 100 includes one such reference current control signal generator 300 associated with each word of output or every sixteen sensing devices 105B. Such reference current control signal generators 300 may further be associated with one or more additional sensing devices 105B, e.g., sixteen primary sensing devices 105B and one redundant sensing device 105B. Redundancy is commonly utilized in the semiconductor industry to replace, or repair out, defective devices.

The read path between the target memory cell 136 and the sensing device 105B would be substantially the same if the sensing device 105B were a differential sensing device. The primary difference in FIG. 2, as it relates to the invention, would be that the reference current generator 301 would be coupled to provide the reference current to an input of the differential sensing device different from the input coupled to receive the sensed current as shown in FIG. 1A. Subsequent discussion of the design characteristics of the reference current control signal generator 300 thus applies whether the memory device 100 utilizes a single-ended sensing device or a differential sensing device.

To best mimic the expected residual current of a floating-gate memory cell, it may be desirable to utilize a similar floating-gate memory cell in controlling the reference current. However, use of a dummy floating-gate memory cell requires a trimming operation and leads to undesirable testing during fabrication. As described herein, a resistive component may be used in the reference current control signal generator in place of the floating-gate memory cell to avoid the unnecessary trimming and testing of a dummy floating-gate memory cell.

Figure 3A:
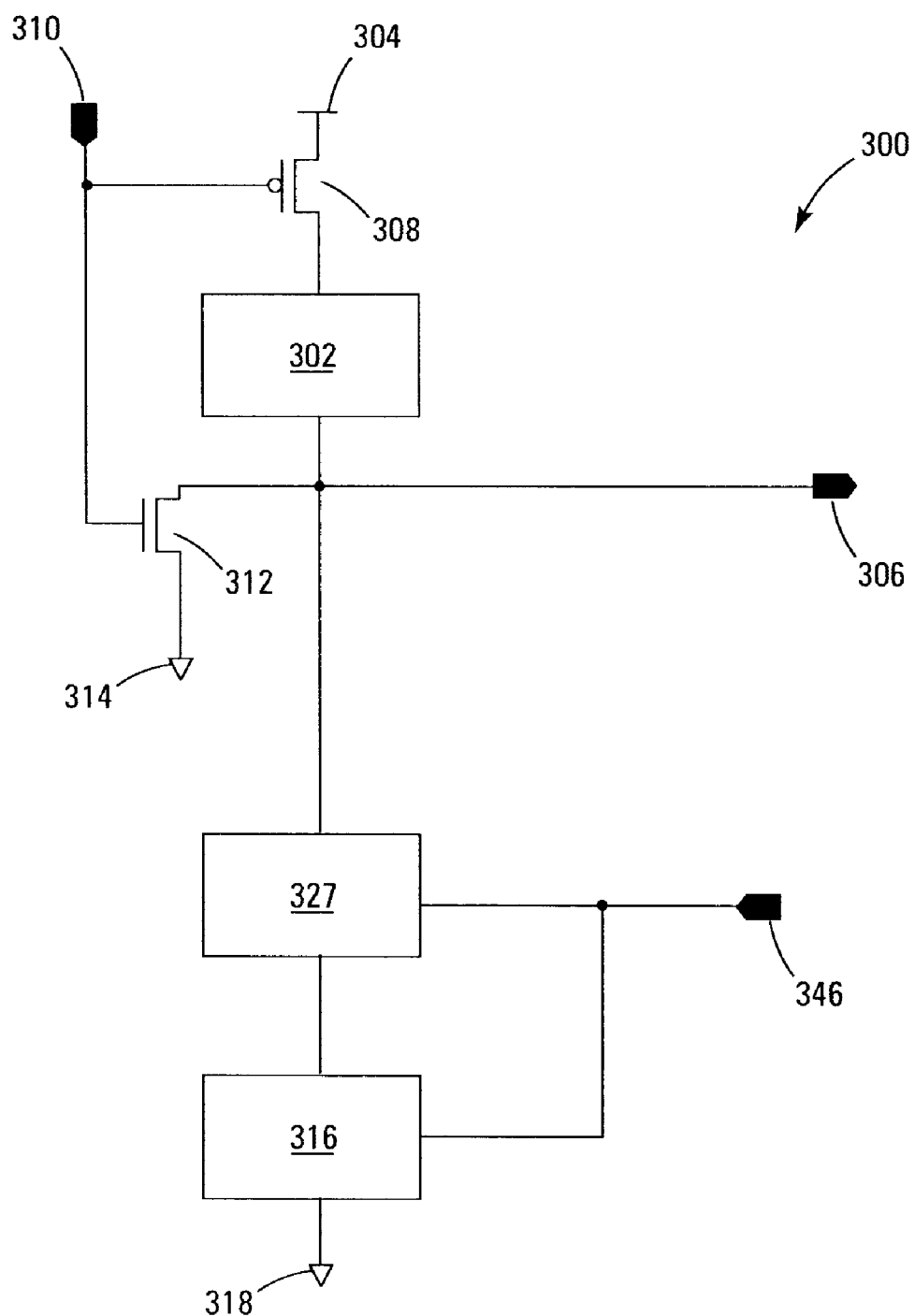
FIG. 3A is a schematic of a reference current control signal generator in accordance with one embodiment of the invention.

FIG. 3A is a schematic of a reference current control signal generator 300 in accordance with one embodiment of the invention. The reference current control signal generator 300 provides the reference current control signal as an output signal. For one embodiment, the reference current control signal has a potential level that varies proportionately with changes in ambient temperature. As ambient temperature increases, the reference current control signal increases. In turn, as applied to the control node of the reference current path 259, the pFET 258 is pushed closer to deactivation with a resultant decrease in the value of the reference current such that the reference current varies inversely with changes in ambient temperature. This will tend to track changes in current flow through a target memory cell in the erased state, as this current also tends to decrease in response to increasing ambient temperatures. The reference current is preferably proportional to the current flow through a target memory cell in the erased state to maintain consistent sensing conditions.

The reference current control signal generator 300 includes a diode 302 having an input coupled to receive a supply potential from a potential node 304 and an output coupled to an output node 306. The potential node 304 is preferably coupled to receive the supply potential Vcc. The output node 306 is coupled to a control node of a reference current path 259, e.g., the gate of the pFET 258.

The reference current control signal generator 300 may optionally be selectively enabled or disabled. An enable signal received at node 310 may be used to enable or disable the reference current control signal generator 300 by providing an FET of a first type, such as pFET 308, coupled between the potential node 304 and the input of the diode 302 and having its gate coupled to receive the enable signal. The reference current control signal generator 300 is enabled when the input of the diode 302 is actively coupled to receive the supply potential from the potential node 304. The enable signal received at node 310 may also be used to pull the output node 306 to a ground potential when the reference current control signal generator 300 is disabled by providing an FET of an opposite type, such as nFET 312, coupled between the output node 306 and a ground potential node 314 and having its gate coupled to receive the enable signal.

The reference current control signal generator 300 further includes a resistive component 316 coupled between the output node 306 and a potential node 318. The potential node 318 is coupled to receive a ground potential. The resistive component 316 preferably has a temperature coefficient of resistivity matched to a temperature coefficient of resistivity of the memory cells 136. For one embodiment, the temperature coefficient of the resistive component 316 is substantially equal to the temperature coefficient of the memory cells 136.

The reference current control signal generator 300 may further include a circuit 327 coupled between the output node 306 and the resistive component 316. The circuit 327 mimics the resistance characteristics of the pass circuits of the memory device. Mimicking the resistance characteristics of the pass circuits facilitates generation of a reference current that more closely tracks the conductance of a selected memory cell 136 and its path to the sensing device 105.

Figure 3B:
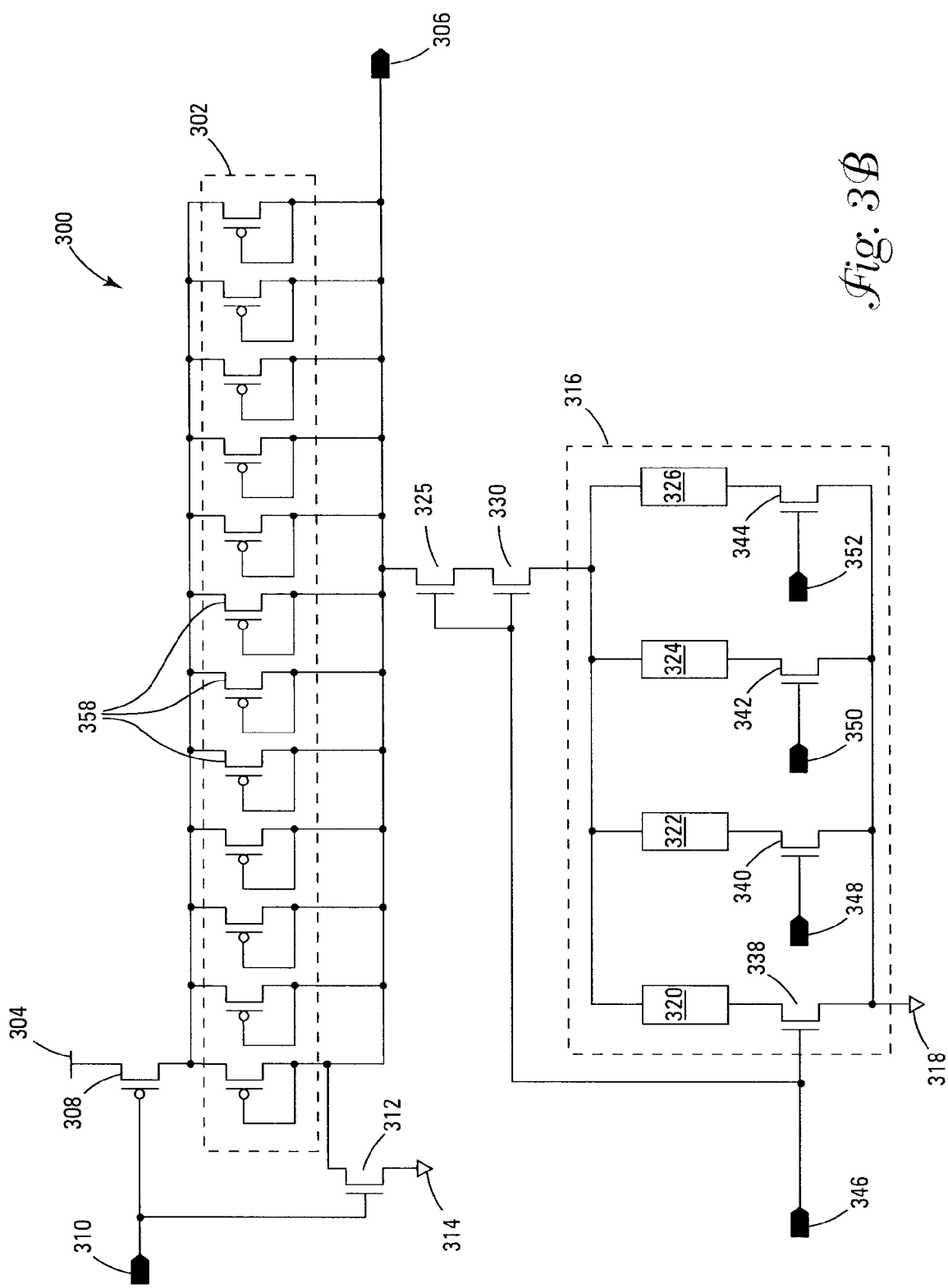
FIG. 3B is a schematic of a reference current control signal generator in accordance with another embodiment of the invention.

FIG. 3B is a schematic of a reference current control signal generator 300 in accordance with another embodiment of the invention. The reference current control signal generator 300 of FIG. 3B includes a diode 302 having an input coupled to receive a supply potential from a potential node 304 and an output coupled to an output node 306. The potential node 304 is preferably coupled to receive the supply potential Vcc. The output node 306 is coupled to the control node of the reference current path 259. For the embodiment depicted in FIG. 3B, the diode 302 contains an array of one or more diode-connected field-effect transistors such as pFETs 358. The pFETs 358 are coupled in parallel between the input and output of the diode 302. Each pFET 358 has a gate coupled to the output of the diode 302, a first source/drain region coupled to the input of the diode 302, and a second source/drain region coupled to the output of the diode 302. For one embodiment, each pFET 358 is preferably sized to be substantially identical to the pFET 258 of the reference current path 259. For a further embodiment, the diode 302 includes 12 pFETs 358 coupled in parallel, each sized to be substantially identical to the pFET 258 of the reference current path 259. For a still further embodiment, the output node 306 is concurrently associated with 16 sensing devices 105 or one word of output.

The reference current control signal generator 300 may optionally be selectively enabled or disabled. An enable signal received at node 310 may be used to enable or disable the reference current control signal generator 300 by providing an FET of a first type, such as pFET 308, coupled between the potential node 304 and the input of the diode 302 and having its gate coupled to receive the enable signal. The reference current control signal generator 300 is enabled when the input of the diode 302 is actively coupled to receive the supply potential from the potential node 304. The enable signal received at node 310 may also be used to pull the output node 306 to a ground potential when the reference current control signal generator 300 is disabled by providing an FET of an opposite type, such as nFET 312, coupled between the output node 306 and a ground potential node 314 and having its gate coupled to receive the enable signal.

The reference current control signal generator 300 further includes a resistive component 316 coupled between the output node 306 and a potential node 318. The potential node 318 is coupled to receive a potential lower than the potential node 304. The potential node 318 is preferably coupled to receive the ground potential Vss. The resistive component 316 includes at least one resistive element, such as resistive element 320. Additional resistive elements, such as resistive elements 322, 324 and 326, may be coupled in parallel with the resistive element 320. As shown in FIG. 3B, each resistive element may selectively present an open path to allow post-fabrication adjustment of resistance of the resistive component 316. This will allow finer adjustment and control of the reference current generated in response to the reference current control signal. The resistive elements are passive resistive devices.

The resistive elements 320, 322, 324 and 326 preferably have temperature coefficients of resistivity matched to a temperature coefficient of resistivity of the memory cells 136. For one embodiment, the temperature coefficients of the resistive elements 320, 322, 324 and 326 are substantially equal to the temperature coefficient of the memory cells 136. One way to match the temperature coefficient of resistivity for an n-channel floating-gate FET is to utilize semiconductor resistors implemented by $n^+$ diffusion. Such semiconductor resistors are common in complementary metal oxide semiconductor (CMOS) devices.

Figure 4:
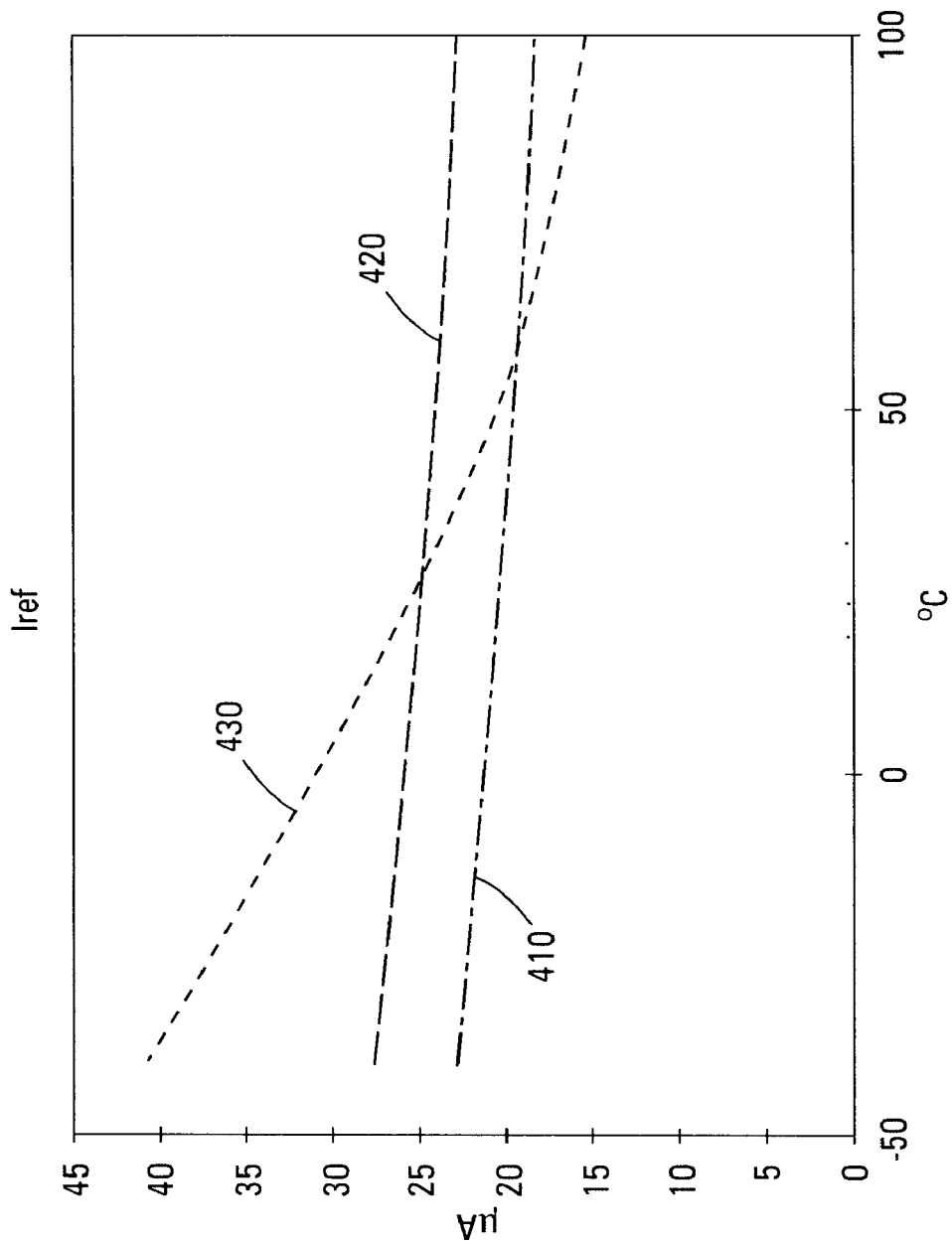
FIG. 4 is a graph of various reference currents as a function of temperature.

FIG. 4 is a graph of reference current $I_{ref}$ as a function of temperature. Line 410 is an example of a reference current generated using a dummy memory cell. Line 420 is an example of a reference current generated using a reference current control signal generator 300 and reference current path 259 in accordance with embodiments of the invention. Line 420 is representative of the degree of tracking that can be obtained using $n^+$ semiconductor resistors in the resistive component 316. By trimming the resistance value of the resistive component 316, the absolute value of the reference current of line 420 can be adjusted to be not only proportional to the reference current generated using a dummy memory cell, but also substantially equal to such reference current using the dummy memory cell. Line 430 is an example of a reference current generated using a high-voltage nFET. Use of a high-voltage nFET as the basis for generating a reference current does not exhibit good tracking with the expected current from a memory cell and is thus not a good candidate for developing the reference current.

Returning to FIG. 3B, the first resistive element 320 has a first resistance value, the second resistive element 322 has a second resistance value, the third resistive element 324 has a third resistance value and the fourth resistive element 326 has a fourth resistance value. For one embodiment, the second resistance value is substantially equal to the first resistance value, the third resistance value is approximately one-half the first resistance value and the fourth resistance value is approximately one-fourth the first resistance value. For a further embodiment, the first resistance value is approximately 16 k$\Omega$. As shown, resistive element 322 selectively presents an open path using nFET 340 in response to a control signal received at node 348, resistive element 324 selectively presents an open path using nFET 342 in response to a control signal received at node 350, and resistive element 326 selectively presents an open path using nFET 344 in response to a control signal received at node 352. Each control signal is distinct, allowing selection of the combined resistance value of the resistive component 316 after fabrication.

The reference current control signal generator 300 may further include one or more field-effect transistors coupled between the output node 306 and the resistive component 316. For the embodiment depicted in FIG. 3, the reference current control signal generator 300 includes a first nFET 325 and a second nFET 330 coupled in series between the output node 306 and the resistive component 316. The nFET 325 is preferably sized to be substantially identical to the pass transistor 225 of the pass circuit 210 and the nFET 330 is preferably sized to be substantially identical to the pass transistor 230 of the pass circuit 220. In general, the series FETs coupled between the output node 306 and the resistive component 316 should preferably match the pass transistors between a target memory cell 136 and its sensing device 105 in number, type and size.

The nFET 325 and nFET 330 each have their gate coupled to receive a control signal on node 346. The nFET 338 coupled between the resistive element 320 and the second potential node 318 further has its gate coupled to receive the control signal on node 346. The node 346 may be coupled to receive a supply potential as the control signal, thereby activating the nFETs 325, 330 and 338. Alternatively, the node 346 may be coupled to receive the output of a voltage divider. As such, the control signal may be a reduced potential level, such as Vcc/2, and may result in at least a partial activation of the nFETs 325, 330 and 338.

By matching component sizing and layout symmetry of the transistors and parasitic components of the reference current control signal generator 300 with the component sizing and layout symmetry of the transistors and parasitic components of the sensing path, reference current generators in accordance with the invention are able to track the expected sensed current of a target memory cell across variations in supply voltage. Further, by matching temperature coefficients of resistivity between the resistive component 316 and the memory cells, reference current generators in accordance with the invention are able to track the expected sensed current of a target memory cell across variations in ambient temperature.

Conclusion

Sensing a current indicative of a data value of a memory cell is typically facilitated with a reference current. The reference current can be used to develop a potential level for comparison to a potential level developed by a target memory cell using a differential sensing device. Alternatively, the reference current can be combined with a sensed current as input to a single-ended sensing device to overcome any leakage of a target memory cell and reduce the likelihood of a false indication of an erased state of the target memory cell. To maintain consistency in sensing, the reference current is preferably proportional to the expected sensed current from an erased target cell across a variety of operating conditions.

Reference current generators are described for producing a reference current that is proportional to an expected sensed current of a target floating-gate memory cell in its conductive state. The reference current is compensated to track the expected sensed current across variations in both ambient temperature and supply voltage. The reference current generators are able to track the expected sensed current of a floating-gate memory cell without using a floating-gate transistor in the generator.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A reference current generator, comprising:
   a reference current path having a control node coupled to receive a reference current control signal and having an output for providing a reference current responsive to the reference current control signal; and
   a reference current control signal generator for generating the reference current control signal, wherein the reference current control signal generator comprises:
      an output node coupled to the control node of the reference current path;
      a diode coupled between a first potential node and the output node of the reference current control signal generator, wherein the first potential node is coupled to receive a first potential; and
      a resistive component coupled between a second potential node and the output node of the reference current control signal generator, wherein the second potential node is coupled to receive a second potential.

2. The reference current generator of claim 1, wherein the second potential is lower than the first potential.

3. The reference current generator of claim 1, wherein the first potential is a supply potential and the second potential is a ground potential.

4. The reference current generator of claim 1, wherein the diode further comprises a plurality of diode-connected field-effect transistors coupled in parallel between the first potential node and the output node of the reference current control signal generator.

5. The reference current generator of claim 4, wherein each field-effect transistor of the plurality of diode-connected field-effect transistors is a p-channel field-effect transistor.

6. The reference current generator of claim 5, wherein the reference current path comprises a p-channel field-effect transistor coupled between a third potential node and the output of the reference current path and having a gate coupled to receive the reference current control signal, and wherein each p-channel field-effect transistor of the plurality of diode-connected field-effect transistors is sized to be substantially identical to the p-channel field-effect transistor of the reference current path.

7. The reference current generator of claim 1, wherein the reference current generator is coupled to a sensing device of a memory device, and wherein the reference current control signal generator further comprises at least one field-effect transistor coupled in series between the resistive component and the output node of the reference current control signal generator.

8. The reference current generator of claim 7, wherein each at least one field-effect transistor is sized to be substantially identical to a pass transistor coupled between a target memory cell of the memory device and an input of the sensing device.

9. The reference current generator of claim 1, wherein the resistive component further comprises:
   a first resistive element coupled between the second potential node and the output node of the reference current control signal generator;
   a first field-effect transistor coupled between the first resistive element and the second potential node and responsive to a first control signal;
   a second resistive element coupled in parallel with the first resistive element between the second potential node and the output node of the reference current control signal generator; and
   a second field-effect transistor coupled between the second resistive element and the second potential node and responsive to a second control signal different from the first control signal.

10. The reference current generator of claim 9, wherein the first control signal is a supply potential.

11. The reference current generator of claim 9, wherein the first control signal is received from an output of a voltage divider.

12. The reference current generator of claim 9, wherein the first control signal is approximately Vcc/2.

13. The reference current generator of claim 9, wherein the resistive component further comprises:
   at least one additional resistive element coupled in parallel with the first resistive element between the second potential node and the output node of the reference current control signal generator; and
   at least one additional field-effect transistor, each additional field-effect transistor coupled between one of the additional resistive elements and the second potential node and each additional field-effect transistor responsive to an additional control signal different from the first control signal.

14. The reference current generator of claim 1, wherein the resistive component comprises a plurality of resistive elements selectively coupled in parallel between the second potential node and the output node of the reference current control signal generator.

15. A reference current generator, comprising:
- a reference current control signal generator for generating a reference current control signal on an output node, wherein the reference current control signal generator comprises:
  - a plurality of diode-connected p-channel field-effect transistors, each diode-connected p-channel field-effect transistor having a first source/drain region coupled to receive a first potential from a first potential node, a second source/drain region coupled to the output node of the reference current control signal generator, and a gate coupled to the output node of the reference current control signal generator;
  - a first n-channel field-effect transistor having a first source/drain region coupled to the output node of the reference current control signal generator, a second source/drain region, and a gate coupled to receive a first control signal;
  - a second n-channel field-effect transistor having a first source/drain region coupled to the second source/drain region of the first field-effect transistor, a second source/drain region, and a gate coupled to receive the first control signal; and
  - a resistive component having an input coupled to the second source/drain region of the second field-effect transistor and an output coupled to receive a second potential from a second potential node, the resistive component including a first resistive element coupled between the second source/drain region of the second field-effect transistor and the second potential node and a third n-channel field-effect transistor coupled between the first resistive element and the second potential node, the third n-channel field effect transistor having a gate coupled to receive the first control signal; and
- a reference current path having a p-channel field-effect transistor coupled between a third potential node and an output of the reference current path and having a gate coupled to receive the reference current control signal;
- wherein each p-channel field-effect transistor of the plurality of diode-connected p-channel field-effect transistors is sized to be substantially identical to the p-channel field-effect transistor of the reference current path.

16. The reference current generator of claim 15, wherein the output of the reference current path is coupled to an input of a sensing device of a memory device, wherein the first n-channel field-effect transistor is sized to be substantially identical to a first pass transistor coupled between a floating-gate memory cell and the sensing device, and wherein the second n-channel field-effect transistor is sized to be substantially identical to a second pass transistor coupled between the floating-gate memory cell and the sensing device.

17. The reference current generator of claim 15, wherein the first control signal is a supply potential.

18. The reference current generator of claim 15, wherein the first control signal is received from an output of a voltage divider.

19. The reference current generator of claim 15, wherein the first control signal is approximately Vcc/2.

20. The reference current generator of claim 15, wherein the reference current is less than one-half an expected current flow through the floating-gate memory cell in an erased state.

21. The reference current generator of claim 15, wherein the reference current is approximately one order of magnitude less than an expected current flow through the floating-gate memory cell in an erased state.

22. A flash memory device, comprising:
- an array of floating-gate memory cells;
- a single-ended sensing device for sensing a programmed state of a target floating-gate memory cell, wherein the sensing device has an input selectively coupled to the target floating-gate memory cell through one or more pass transistors;
- a reference current path having a p-channel field-effect transistor coupled between a first potential node and the input of the sensing device, wherein the first potential node is coupled to receive a first potential for providing a reference current to the input of the sensing device responsive to a reference current control signal; and
- a reference current control signal generator for generating the reference current control signal, wherein the reference current control signal generator comprises:
  - an output node coupled to the control node of the reference current path;
  - a diode coupled between a second potential node and the output node of the reference current control signal generator, wherein the second potential node is coupled to receive a second potential;
  - a resistive component coupled between a third potential node and the output node of the reference current control signal generator, wherein the third potential node is coupled to receive a third potential; and
  - a circuit comprising one or more field-effect transistors coupled in series between the diode and the resistive component and matched in number, type and size to the pass transistors.

23. A flash memory device, comprising:
- an array of floating-gate memory cells;
- a differential sensing device for sensing a programmed state of a target floating-gate memory cell, wherein the sensing device has a first input selectively coupled to the target floating-gate memory cell through one or more pass transistors;
- a reference current path having a p-channel field-effect transistor coupled between a first potential node and a second input of the sensing device, wherein the first potential node is coupled to receive a first potential for providing a reference current to a second input of the sensing device responsive to a reference current control signal; and
- a reference current control signal generator for generating the reference current control signal, wherein the reference current control signal generator comprises:
  - an output node coupled to the control node of the reference current path;
  - a diode coupled between a second potential node and the output node of the reference current control signal generator, wherein the second potential node is coupled to receive a second potential;
  - a resistive component coupled between a third potential node and the output node of the reference current control signal generator, wherein the third potential node is coupled to receive a third potential; and
  - a circuit comprising one or more field-effect transistors coupled in series between the diode and the resistive component and matched in number, type and size to the pass transistors.

24. A flash memory device, comprising:

an array of floating-gate memory cells;

a sensing device coupled for sensing a programmed state of a target floating-gate memory cell, wherein the sensing device is selectively coupled to the target floating-gate memory cell through one or more pass circuits;

a reference current path having a control node coupled to receive a reference current control signal and an output coupled to provide a reference current to the sensing device, wherein the reference current is inversely proportional to a value to the reference current control signal; and a reference current control signal generator for generating the reference current control signal, wherein the reference current control signal generator comprises:

an output node coupled to the control node of the reference current path;

a diode coupled between a first potential node and the output node of the reference current control signal generator, wherein the first potential node is coupled to receive a first potential;

a resistive component coupled between a second potential node and the output node of the reference current control signal generator, wherein the second potential node is coupled to receive a second potential lower than the first potential; and a circuit coupled between the diode and the resistive component, wherein the circuit mimics the resistance characteristics of the pass circuits.

25. The flash memory device of claim 24, wherein the resistive component further comprises one or more resistive elements have temperature coefficients of resistivity matched to a temperature coefficient of resistivity of the floating-gate memory cells.

26. The flash memory device of claim 24, wherein the resistive component further comprises one or more $n^+$ semiconductor resistors.

27. An electronic system, comprising:

a flash memory device; and a processor coupled to receive data values from the flash memory device;

wherein the flash memory device comprises:

an array of floating-gate memory cells;

a sensing device coupled for sensing a programmed state of a target floating-gate memory cell, wherein the sensing device is selectively coupled to the target floating-gate memory cell through one or more pass circuits;

a reference current path having a control node coupled to receive a reference current control signal and an output coupled to provide a reference current to the sensing device, wherein the reference current is inversely proportional to a value to the reference current control signal; and a reference current control signal generator for generating the reference current control signal, wherein the reference current control signal generator comprises:

an output node coupled to the control node of the reference current path;

a diode coupled between a first potential node and the output node of the reference current control signal generator, wherein the first potential node is coupled to receive a first potential;

a resistive component coupled between a second potential node and the output node of the reference current control signal generator, wherein the second potential node is coupled to receive a second potential lower than the first potential; and a circuit coupled between the diode and the resistive component, wherein the circuit mimics the resistance characteristics of the pass circuits.

\* \* \* \* \*

UNITED STATES PATENT AND TRADEMARK OFFICE
CERTIFICATE OF CORRECTION

PATENT NO. : 6,697,283 B2
DATED : February 24, 2003
INVENTOR(S) : Marotta

It is certified that error appears in the above-identified patent and that said Letters Patent is hereby corrected as shown below:

<u>Title page,</u>
Item [63], Related U.S. Application Data, replace "10/036,757" with -- 10/036,751 --
Item [30], Foreign Application Priority Data, replace "RM2001A0001" with
-- RM2001A000001 --; and RM2001A0528" with -- RM2001A000528 --

Signed and Sealed this

Twenty-seventh Day of July, 2004

JON W. DUDAS
*Acting Director of the United States Patent and Trademark Office*